United States Patent
Miyamoto

[19]

[11] Patent Number: 6,143,377
[45] Date of Patent: Nov. 7, 2000

[54] PROCESS OF FORMING A REFRACTORY METAL THIN FILM

[75] Inventor: Takaaki Miyamoto, Kanagawa, Japan

[73] Assignee: Sony Corporation, Tokyo, Japan

[21] Appl. No.: 09/024,893

[22] Filed: Feb. 17, 1998

Related U.S. Application Data

[62] Division of application No. 08/576,685, Dec. 21, 1995, Pat. No. 5,747,384.

[30] Foreign Application Priority Data

Dec. 26, 1994 [JP] Japan .............................. P06-323187

[51] Int. Cl.[7] .............................. H05H 1/24; C23C 16/08
[52] U.S. Cl. ...................... 427/576; 427/534; 427/255.4; 427/250; 427/309; 427/99; 427/372.2
[58] Field of Search ..................................... 427/534, 535, 427/255.4, 576, 372.2, 309, 99, 250; 438/685, 688

[56] References Cited

U.S. PATENT DOCUMENTS

| | | | |
|---|---|---|---|
| 4,331,710 | 5/1982 | Nozaki et al. ............................. | 427/94 |
| 4,715,937 | 12/1987 | Moslehi et al. ......................... | 204/177 |
| 4,724,159 | 2/1988 | Yamazaki ................................ | 427/451 |
| 5,011,705 | 4/1991 | Tanaka .................................... | 427/534 |
| 5,155,063 | 10/1992 | Ito ........................................... | 437/190 |
| 5,173,327 | 12/1992 | Sandhu et al. .......................... | 427/573 |
| 5,174,881 | 12/1992 | Iwasaki et al. ..................... | 204/298.25 |
| 5,620,559 | 4/1997 | Kirkuchi ................................. | 438/723 |
| 5,719,410 | 2/1998 | Suehiro et al. .......................... | 257/77 |

FOREIGN PATENT DOCUMENTS

| | | |
|---|---|---|
| 63-256671 | 10/1988 | Japan . |
| 2-162722 | 6/1990 | Japan . |
| 6-323052 | 11/1994 | Japan . |

OTHER PUBLICATIONS

G.S. Higashi et al, Appl. Phys. lett. 56(7) p. 656, Feb. 1990.
A. Kishimoto, Jpn. J. Appl. Phys. 29(10) p. 2273, Oct. 1990.

*Primary Examiner*—Roy V. King
*Attorney, Agent, or Firm*—Ronald P. Kananen; Rader, Fishman & Grauer

[57] ABSTRACT

A process for forming a refractory metal thin film on a substrate by subjecting a gaseous mixture containing a halide of a refractory metal and the hydrogen gas to a plasma chemical vapor deposition, comprising the step of adjusting a mixing ratio of the halide of the refractory metal to the hydrogen gas to a relatively small value at an initial stage of the process and, subsequent to the initial stage of the process, adjusting the mixing ratio of the halide of the refractory metal to the hydrogen gas to a relatively large value.

14 Claims, 7 Drawing Sheets

PROCESS OF FORMING A REFRACTORY METAL THIN FILM

This application is a divisional of application Ser. No. 08/576,685 filed Dec. 21, 1995, now U.S. Pat. No. 5,747,384.

BACKGROUND OF THE INVENTION

This invention relates to a process of forming a refractory metal thin film on a substrate by using a chemical vapor deposition (CVD), and more particularly to a process of forming a refractory metal thin film on a substrate with a good coverage of a surface of the substrate and without damage to the substrate.

In a production process for semiconductor devices, it is generally known that, when an aluminum-series material and a tungsten material are buried into a contact hole of an interlevel insulator film layer provided on the substrate, a titanium film layer is preliminarily formed at least on bottom and side surfaces of the contact hole.

The titanium film layer functions as a barrier metal layer for preventing an alloy reaction between aluminum and silicon when the aluminum-series material is buried into the contact hole. Whereas, the titanium film layer functions as a tight-contacting layer when the tungsten material is buried into the contact hole. However, the titanium film layer cannot function as a barrier metal layer nor a tight-contacting layer by itself though it is excellent in achieving a low ohmic contact. Therefore, the titanium film layer is generally used together with a titanium nitride film layer laminated thereover.

Meanwhile, an aspect ratio of the contact hole becomes increased in association with a high integration of semiconductor devices. Under this circumstance, it is essential that a vertical component of the particles spattered is strengthened by a collimated spattering method to form the above mentioned titanium film layer on an inside surface of the very small contact hole having as small a diameter as 0.25 $\mu$m and as large an aspect ratio as 4 with a good coverage of its surface to be treated.

However, it is difficult to form the titanium film layer on a bottom surface of an extremely fine contact hole having an aspect ratio exceeding 5 even by the collimated spattering method. Consequently, an attempt has been recently made to apply a chemical vapor deposition (CVD) method exhibiting an excellent coverage upon the formation of the titanium film layer. It is expected that the titanium film layer or titanium silicide (TiSi$_x$) film layer is formed by reduction of a halide gas, typically TiCl$_4$, by using a hydrogen gas (H$_2$) or a silane gas (SiH$_4$). The formation of the titanium film layer or the titanium silicide film layer is, for example, based on the reduction reaction represented by the following chemical equation (1) in which a titanium film layer is produced by using a titanium tetrachloride gas (TiCl$_4$) and a hydrogen gas (H$_2$).

$$TiCl_4 + 2H_2 \rightarrow Ti + 4HCl \qquad (1)$$

FIG. 1 shows, in section, one example of the prior semiconductor devices which has been actually produced by using the chemical vapor deposition method. In the prior semiconductor device, a semiconductor wafer is composed of a silicon substrate 101 and an interlevel insulator film layer 102 formed on the substrate. The semiconductor wafer is provided with a contact hole 103 formed through the interlevel insulator film layer 102. When such a semiconductor wafer with the contact hole 103 is subjected to the chemical vapor deposition method in which a titanium tetrachloride gas (TiCl$_4$) and a hydrogen gas (H$_2$) are used, there occurs a problem that the silicon substrate 101 is undesirably etched so that a corroded portion 104 is formed thereon. In this case, a deposited titanium film layer 105 is converted to a titanium silicide layer TiSi$_2$ 106 at a position where the titanium film layer is brought into contact with the silicon substrate 101.

The corroded portion 104 of the silicon substrate 101 is caused by reduction of TiCl$_4$ not by H$_2$ as represented by the above-mentioned equation (1) but by Si as represented by the following equation (2).

$$TiCl_4 + Si \rightarrow Ti + SiCl_4 \qquad (2)$$

Since a bonding energy between a hydrogen atom and a chlorine atom is 431 kJ/mole and that between a silicon atom and a chlorine atom is 322 kJ/mole, it would be suggested that the reduction of TiCl$_4$ is likely to be caused by the hydrogen gas (H$_2$) rather than the silicon atom. Nevertheless, the reduction of the silicon substrate 101 is actually caused by the silicon atom. The reason therefor is considered as follows. That is, the reduction reaction is caused due to the fact that an adsorption probability of the TiCl$_4$ gas to the silicon substrate 101 is higher than that of the TiCl$_4$ gas to the hydrogen gas.

Particularly, in a case where a native oxide film remains non-uniformity on the silicon substrate 101, a reaction between the silicon substrate and the TiCl$_4$ gas proceeds unevenly through a thin or lacking portion of the native oxide film. Since impurities are diffused into a portion of the silicon substrate 101 to which the contact hole 103 is opposed, the above-mentioned etching is drastically caused at the portion, which results in generating deficiencies such as an increased contact resistance and an increased leak current.

In addition, upon formation of other refractory metal film layers such as a tungsten film layer and a molybdenum film layer as well as the titanium film layer, there also occurs a similar problem concerning the undesirable etching of the silicon substrate 101. Further, when such a refractory metal film layer should be formed not only on the silicon substrate 101 but also on the aluminum-series material layer, identical deficiencies due to the etching are observed.

SUMMARY OF THE INVENTION

It is therefore an object of the present invention to provide a process of forming a refractory metal film layer on a substrate in which the formation of the refractory metal film layer is performed with a good coverage over a surface of the substrate and without damage to the substrate.

In accordance with one aspect of the present invention, there is provided a process of forming a refractory metal thin film layer on a substrate by subjecting a gaseous mixture containing a halide of a refractory metal and a hydrogen gas to a plasma chemical vapor deposition, comprising the steps of:

adjusting a mixing ratio of the halide of the refractory metal to the hydrogen gas to a relatively small value at an initial stage of the process; and subsequent to the initial stage of the process, adjusting the mixing ratio of the halide of the refractory metal to the hydrogen gas to a relatively large value.

Meanwhile, it is preferred that a native oxide film existing on the substrate is preliminarily removed and then the above-mentioned formation of the refractory metal thin film layer is performed while preventing the substrate from being in contact with the atmosphere.

Further, in accordance with another aspect of the present invention, there is provided a process of forming a refractory metal thin film on a substrate, comprising the steps of:

preliminarily removing a native oxide film on the substrate;

nitriding a surface of the substrate by using a gas containing a nitrogen atom at least within a molecule therein, while preventing the substrate from coming into contact with the atmosphere; and subjecting a gaseous mixture containing a halide of a refractory metal and a hydrogen gas to a plasma chemical vapor deposition to deposit said refractory metal thin film on the substrate.

Thus, when the mixture containing a halide of a refractory metal and a hydrogen gas is subjected to a plasma chemical vapor deposition, a mixing ratio of the halide of the refractory metal to the hydrogen gas is adjusted to a relatively small value at an initial stage of the formation of the refractory metal thin film. By this, the halide of the refractory metal shows a low probability of adsorption to the silicon substrate and an aluminum wiring film layer, which results in preventing the halide of the refractory metal from being reduced by the silicon substrate and the aluminum wiring film layer. Thus, the formation of the refractory metal thin film can be performed without damage to the substrate but with a high purity.

After the formation of the refractory metal thin film is carried out to some extent, the mixing ratio of the halide of the refractory metal to the hydrogen gas increases to a relatively large value. This measure prohibits undesirable contact of the halide of the refractory metal with the silicon substrate and the aluminum wiring film layer whereby the reduction of the halide by silicon of the silicon substrate and aluminum of the wiring film layer is effectively prevented. In the case where the mixing ratio of the halide of the refractory metal to the hydrogen gas is adjusted to the relatively large value, the refractory metal thin film produced under such a condition, shows a excellent surface smoothness.

When a native oxide film present on the surface of the silicon substrate is beforehand removed, the refractory metal thin film is uniformly formed on the substrate with a good coverage over the surface thereof. In addition, it is realized that an ohmic contact between the refractory metal thin film and the silicon substrate is made at a low resistance. Particularly, when the formation of the refractory metal thin film on the silicon substrate is carried out without the existence of the native oxide film, the refractory metal thin film reacts with silicon of the silicon substrate to form a uniform film of silicide of the refractory metal, which results in lowering a contact resistance between the refractory metal thin film and the wiring film layer formed thereon.

When the surface of the silicon substrate or an exposed portion of the aluminum wiring film layer is partially nitrided, a reaction between the halide of the refractory metal and the above-mentioned silicon substrate or the aluminum wiring film layer is prohibited effectively so that the formation of the refractory metal thin film can be performed without damage to the silicon substrate and the aluminum wiring film layer. This is due to the fact that a bonding energy between the silicon atom and the nitrogen atom, or between the aluminum atom and the nitrogen atom is larger than that between the silicon atom and the halogen atom, or the aluminum atom and the halogen atom. As a result, a silicon nitride film layer formed on the silicon substrate or an aluminum nitride film layer formed on the aluminum wiring film layer silicon prevents the silicon substrate and the aluminum wiring film layer from suffering from the etching upon formation of the refractory metal thin film.

Other and additional objects and features will become more apparent from the following detailed description, taken in conjunction with the accompanying drawings.

DETAILED DESCRIPTION OF THE INVENTION

Figure 1:
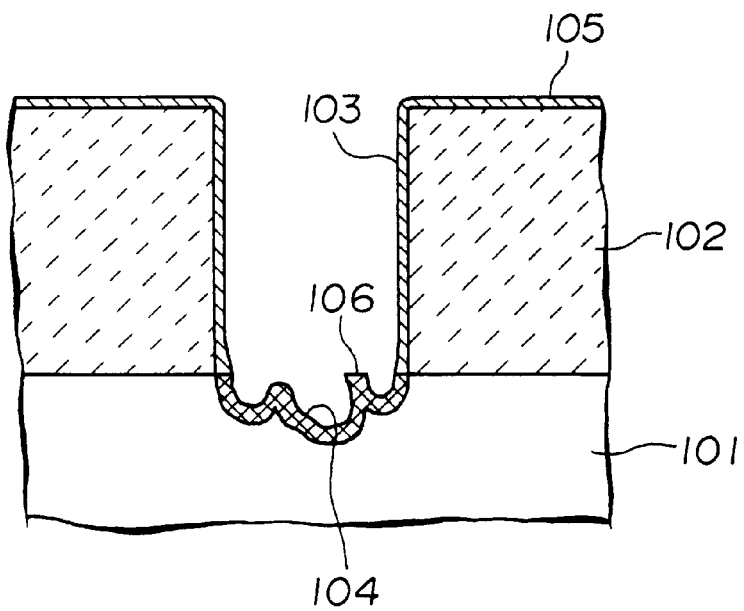
FIG. 1 is a sectional view schematically showing a semiconductor wafer produced according to a conventional method, in which a portion of a surface of a silicon substrate which is exposed to an interior of a contact hole suffers from etching upon formation of a titanium film layer thereover.

The present invention is basically concerned with a process of forming a refractory metal thin film on a substrate by subjecting a gaseous mixture containing a halide of a refractory metal and a hydrogen gas to a plasma chemical vapor deposition. In the process, a mixing ratio of the halide of the refractory metal to a hydrogen gas is adjusted to a relatively small value at an initial stage of the process while, subsequent to the initial stage of the process, the mixing ratio of the halide of the refractory metal to the hydrogen gas increases to a relatively large value.

Moreover, the present invention is also concerned with a process of forming a refractory metal thin film on a substrate, which comprises preliminarily removing a native oxide film existing on the substrate, nitriding a surface of the substrate by using a gas containing a nitrogen atom at least within a molecule thereof while preventing the substrate from coming into contact with the atmosphere, and subjecting a gaseous mixture containing a halide of a refractory metal and the hydrogen gas to a plasma chemical vapor deposition to deposit the refractory metal thin film on the substrate. In the latter process, it is not required that the mixing ratio of the halide of the refractory metal to the hydrogen gas varies depending upon the elapsed time or the stage of the process.

Incidentally, the above-mentioned gas containing a nitrogen atom at least in a molecule therein is preferably at least one gaseous material selected from the group consisting of a nitrogen gas ($N_2$), an ammonia gas ($NH_3$) and a hydrazine gas ($N_2H_4$). The surface of the substrate can be nitrided by carrying out a plasma treatment in a gas atmosphere containing such a gaseous material.

In any of the processes mentioned above, the removal of the native oxide film is performed by the plasma treatment using at least one gaseous material selected from the group consisting of a hydrogen gas ($H_2$), a silane gas ($SiH_4$) and an argon gas (Ar).

The process according to the present invention can be also applied to a formation of a refractory metal thin film on an insulated substrate to at least a portion of a surface of which an inside silicon material is exposed. That is, in a case where an interlevel insulator film layer is formed on the surface of the substrate and a contact hole is opened through the interlevel insulator film layer such that the silicon material of the substrate is exposed to a bottom of the contact hole, the refractory metal thin film can be formed as a part of a barrier metal according to the process of the present invention. In this case, the refractory metal thin film on the silicon substrate is converted to a silicide thereof at a boundary between the refractory metal thin film and the silicon substrate whereby an ohmic contact of a low resistance can be realized therebetween.

The process according to the present invention is also effectively applicable to the case where the formation of the refractory metal thin film is necessary to be made on such a substrate to at least a portion of a surface of which an aluminum wiring film layer is exposed. In this case, the refractory metal thin film is formed as a barrier metal layer on at least a portion of the surface of the substrate corresponding to a bottom of a via hole formed through the interlevel insulator film layer. Furthermore, the process according to the present invention is similarly applicable to the case where the formation of the refractory metal thin film is to be made on a substrate to at least a portion of a surface of which a tungsten-series material is exposed.

Examples of the refractory metal thin film produced by the process according to the present invention may include a tungsten film, a molybdenum film or any other refractory metal film known in the art. Especially, the process of the present invention is preferably applied to the formation of a titanium film layer. When the titanium film layer is formed as a barrier metal layer on the substrate, it is preferred that the titanium film layer be further covered with a titanium nitride film layer.

Meanwhile, in a case where the titanium film layer or titanium/titanium nitride film layers are formed as a barrier metal layer, an aluminum wiring film layer is further deposited on the barrier metal layer. At this time, when very small contact holes having a high aspect ratio are provided, the formation of the aluminum wiring film layer is carried out while burying the contact holes therewith by using an appropriate process such as a high-pressure reflowing method or the like. Alternatively, a tungsten plug can be formed in a contact hole by using a bracket tungsten chemical vapor deposition method.

EXAMPLES

The present invention is described in more detail below by way of examples by referring to the accompanying drawings.

Example 1

This example shows a first process of forming a refractory metal thin film on a substrate according to the present invention. In Example 1, a titanium film layer as a refractory metal thin film was deposited on bottom and side surfaces of a contact hole formed through an interlevel insulator film layer on a silicon substrate by using a plasma chemical vapor deposition method in which the mixing ratio of a $TiCl_4$ gas to a hydrogen gas were changed between at an initial stage of the film-forming process and at subsequent stage thereof. The process of this example is explained by referring to FIGS. 2 to 5.

Figure 2:
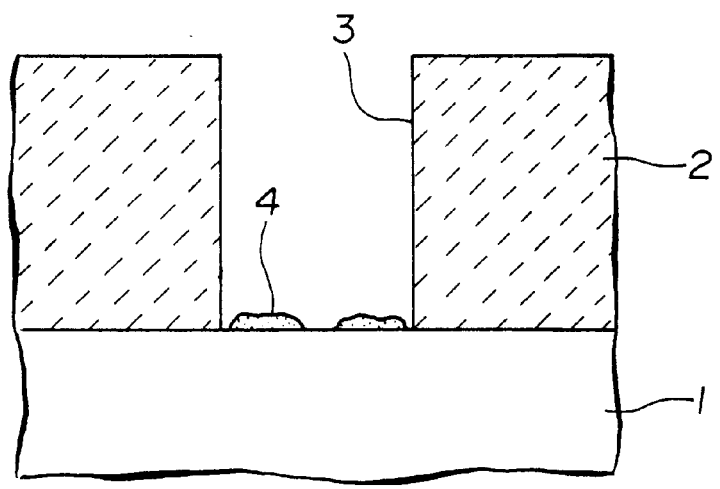
FIG. 2 is a sectional view schematically showing a semiconductor wafer in which a native oxide film is present on the portion of the surface of the silicon substrate which is exposed to an interior of a contact hole.

First, an interlevel insulator film layer 2 made of silicon dioxide and having a thickness of 1 $\mu$m was laminated over a silicon substrate 1, and then the interlevel insulator film layer 2 was formed with a contact hole 3 having a diameter of 0.2 $\mu$m and an aspect ratio of 5 so that a semiconductor wafer was obtained as shown in FIG. 2. The thus obtained semiconductor wafer was washed with dilute hydrofluoric acid to remove a majority of a native oxide film 4 existing on a surface of the silicon substrate 1 which was exposed to an interior of the contact hole 3. Further, a plasma treatment was carried out by using an electron cyclotron resonance plasma (ECR plasma) chemical vapor deposition (CVD) apparatus (hereinafter referred to as "ECR plasma CVD apparatus") to remove the remainder of the native oxide film 4 under the following conditions:

Conditions of Plasma Treatment for Removal of Native Oxide Film Layer:

Gas introduced:
(1) $H_2$ gas, flow rate; 50 sccm
(2) Ar gas, flow rate; 150 sccm Gas Pressure: 0.4 Pa Temperature: 450° C.

Power of Microwave: 2.8 kW (2.45 GHz)

The remainder of the native oxide film 4 existing on the silicon substrate 1 was completely removed by the plasma treatment. Incidentally, the removal of the remainder of the native oxide film 4 was based on a reduction reaction expressed by the following equation (3).

$$2H_2 + SiO_2 \rightarrow Si + 2H_2O \tag{3}$$

Next, the formation of a titanium film layer was carried out for 30 seconds in the same chamber of the ECR plasma CVD apparatus as used above under the condition (A) in which a mixing ratio of a $TiCl_4$ gas to a hydrogen gas was adjusted to a relatively small value.

Figure 3:
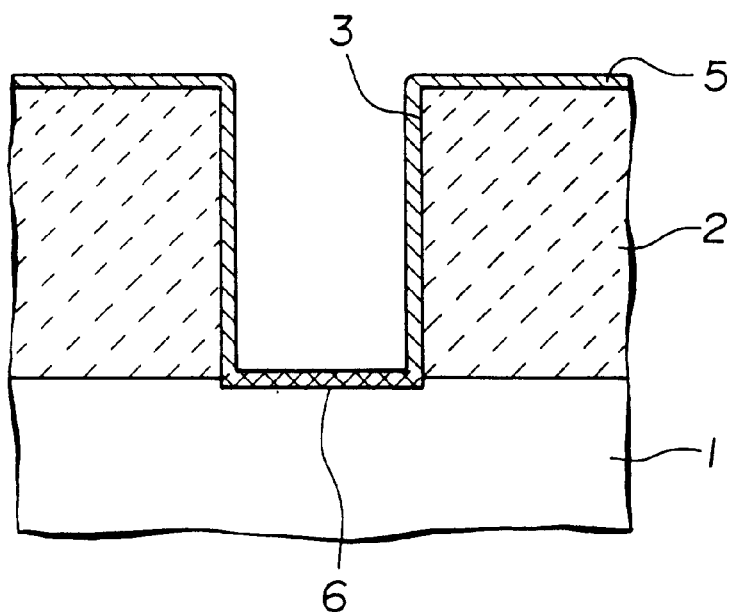
FIG. 3 is a sectional view schematically showing a semiconductor wafer on which a first titanium film layer is formed over the portion of the surface of the silicon substrate after removing the native oxide film from the semiconductor wafer shown in FIG. 2, according to a first process of the present invention.

Condition (A) of Formation of Titanium Film Layer:
Gas introduced:
 (1) $TiCl_4$ gas, flow rate; 3 sccm
 (2) $H_2$ gas, flow rate; 100 sccm
 (3) Ar gas, flow rate; 170 sccm
 (wherein the mixing ratio of the $TiCl_4$ gas to the hydrogen gas was 3%)
Gas Pressure: 0.4 Pa
Temperature: 450° C.
Power of Microwave: 2.8 kW As a result of the above plasma treatment, a first titanium film layer 5 was formed over an entire surface of the semiconductor wafer without suffering from etching of a surface of the silicon substrate 1, as shown in FIG. 3. Meanwhile, a reaction between Ti and Si was immediately caused on the silicon substrate 1 so that a $TiSi_2$ film layer 6 was formed on the silicon substrate 1.

Successively, the formation of a titanium film layer was carried out in the same chamber of the ECR plasma CVD apparatus as used above under the condition (B) in which the mixing ratio of the $TiCl_4$ gas to the hydrogen gas was adjusted to a relatively large value.

Figure 4:
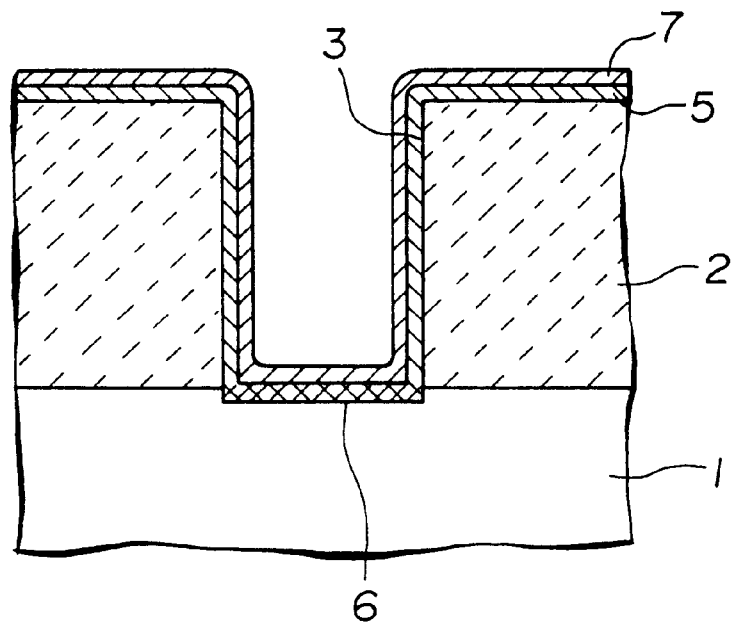
FIG. 4 is a sectional view schematically showing a semiconductor wafer in which a second titanium film layer is formed on the first titanium film layer shown in FIG. 3, according to the first process of the present invention.

Condition (B) of Formation of Titanium Film Layer:
Gas introduced:
 (1) $TiCl_4$ gas, flow rate; 20 sccm
 (2) $H_2$ gas, flow rate; 26 sccm
 (3) Ar gas, flow rate; 170 sccm
 (wherein the mixing ratio of the $TiCl_4$ gas to the hydrogen gas was 77%)
Gas Pressure: 0.13 Pa
Temperature: 450° C.
Power of Microwave: 2.8 kW As a result of the above plasma treatment, a second titanium film layer 7 was formed over a surface of the first titanium film layer 5 or the $TiSi_2$ film layer 6, as shown in FIG. 4.

Thereafter, the formation of a titanium nitride film layer 8 was carried out in the same chamber of the ECR plasma CVD apparatus as used above under the following condition.

Figure 5:
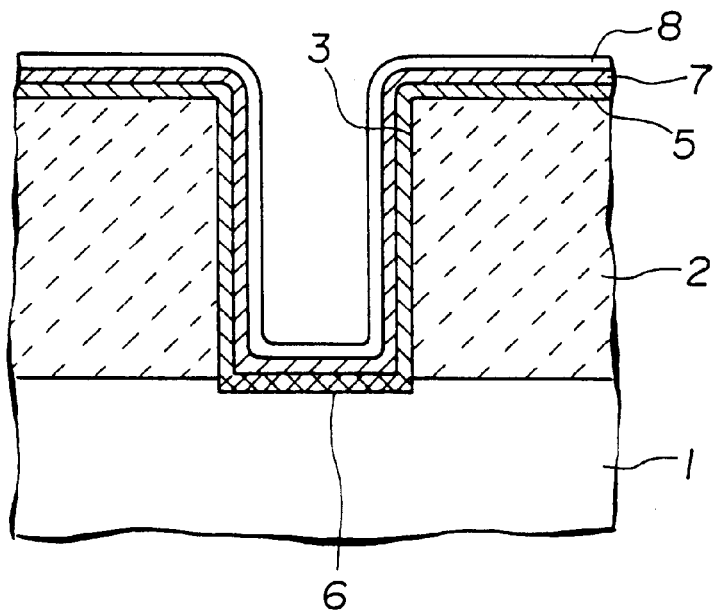
FIG. 5 is a sectional view schematically showing a semiconductor wafer in which a titanium nitride film layer is further formed on the second titanium film layer shown in FIG. 4, according to the first process of the present invention.

Condition of Formation of Titanium Nitride Film Layer 8:
Gas introduced:
 (1) $TiCl_4$ gas, flow rate; 20 sccm
 (2) $N_2$ gas, flow rate; 8 sccm
 (3) $H_2$ gas, flow rate; 26 sccm
Gas Pressure: 0.13 Pa
Temperature: 450° C.
Power of Microwave: 2.8 kW As a result of the above plasma treatment, the second titanium nitride film layer 8 was formed over a surface of the second titanium film layer 7, as shown in FIG. 5.

In the process mentioned above, a barrier metal layer having a two-layered structure composed of the titanium film layer 7 and the titanium nitride film layer 8 was produced within the contact hole 3 with a good coverage of the surface to be treated and without damage to the silicon substrate 1. Further, the barrier metal layer was covered with an upper wiring layer (not shown) made of an aluminum-series material. As a result, it was confirmed that the aluminum-series material was buried into the contact hole 3. In addition, it was also confirmed that the thus formed barrier metal layer had an ohmic contact of a low resistance at boundary regions adjacent to both the silicon substrate 1 and the upper wiring layer, and showed an effect for preventing a grain boundary diffusion of aluminum at the boundary region to the upper wiring layer.

Meanwhile, the reason why the etching of the silicon substrate 1 was not caused upon the formation of the first titanium film layer 5 mentioned above, is that, as shown in the condition (A) above, the mixing ratio of the $TiCl_4$ gas to the hydrogen gas was set to the relatively small value so that the reaction between $TiCl_4$ and Si expressed by the equation (2) was prohibited while the reaction between $TiCl_4$ and $H_2$ expressed by the equation (1) was accelerated. It was found that the thus produced first titanium film layer 5 had a high purity. Whereas, subsequently, the mixing ratio of the $TiCl_4$ gas to the hydrogen gas was set to the relatively large value as shown in the condition (B) above without suffering from etching of the substrate 1, since the $TiSi_2$ film layer 6 was already formed on the silicon substrate 1, which resulted in further acceleration of the reaction expressed by the equation (1). The thus produced second titanium film layer 7 exhibited an extremely smooth surface, which in turn contributed to improvement of a surface smoothness of the titanium nitride film layer 8 formed thereon. This provided a considerably enhanced adherability of the upper wiring layer to the titanium nitride film layer 8.

Example 2

This example shows a second process of forming a refractory metal thin film on a substrate according to the present invention. In Example 2, a titanium film layer as a refractory metal thin film was deposited on bottom and side surfaces of a via hole formed through an interlevel insulator film layer formed on a wiring film layer composed of Al and 0.5% Cu. The process is explained by referring to FIGS. 6 to 9.

Figure 6:
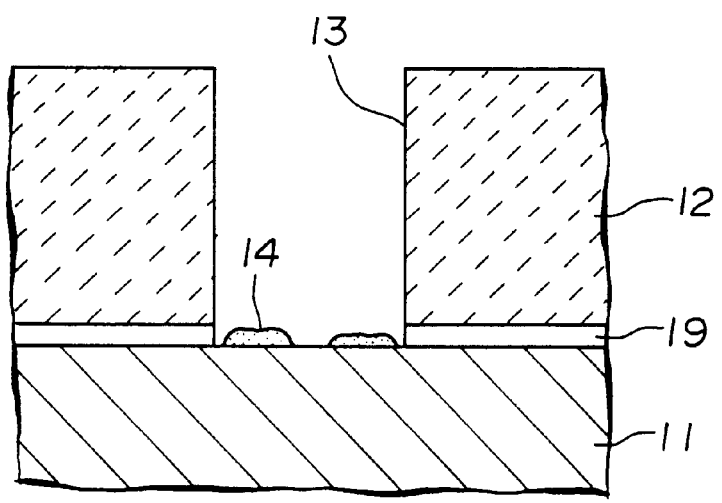
FIG. 6 is a sectional view schematically showing a semiconductor wafer in which a native oxide film is formed on a portion of a wiring film layer which is exposed to an interior of a via hole.

First, an interlevel insulator film layer 12 made of silicon dioxide and having a thickness of 1 μm and a titanium nitride (TiN) film layer 19 were in turn was laminated over a wiring film layer 11 formed of aluminum and 0.5% copper. Further, the interlevel insulator film layer 12 was formed with a via hole 13 having a diameter of 0.2 μm and an aspect ratio of 5 so that a semiconductor wafer as shown in FIG. 6 was prepared. The thus prepared semiconductor wafer was placed within a chamber of the ECR plasma CVD apparatus to remove a native oxide film 14 existing on a portion of the wring film layer 11 which was exposed to an interior of the via hole 13. The removal of the native oxide film 14 by the plasma treatment was carried out in the same manner as described in Example 1 except that the flow rate of the hydrogen ($H_2$) gas was changed to 30 sccm. In the plasma treatment, the native oxide film 14 was removed mainly by a spattering effect of argon (Ar).

Next, the semiconductor wafer was placed within the same chamber of the ECR plasma CVD apparatus and the film formation process was carried out for 30 seconds under the same condition (A) as used in Example 1 above, in which the mixing ratio of the $TiCl_4$ gas to the hydrogen ($H_2$) gas was set to the relatively small value.

Figure 7:
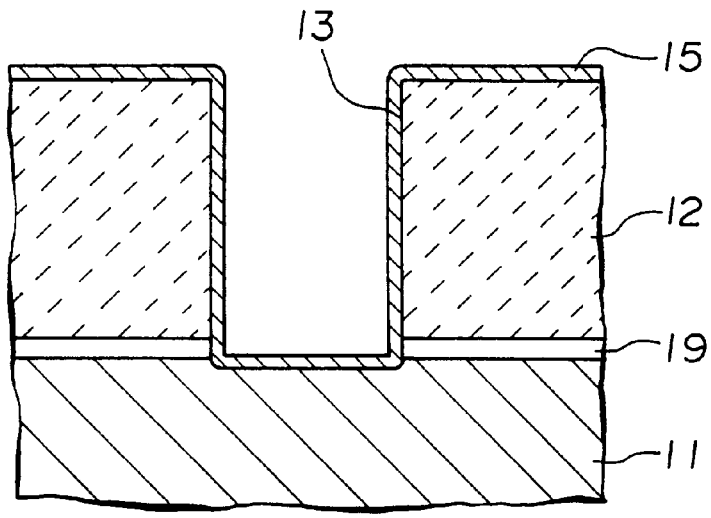
FIG. 7 is a sectional view schematically showing a semiconductor wafer in which a first titanium film layer is formed on the semiconductor wafer shown in FIG. 6, according to a second process of the present invention.

As a result of the above plasma treatment, a first titanium film layer 15 having a high purity was formed over an entire surface of the semiconductor wafer without occurrence of etching on a surface of the wiring film layer 11, as shown in FIG. 7. Meanwhile, upon the formation of the first titanium film layer 15, the native oxide film 14 remaining on the wiring layer 11 was simultaneously removed.

This is caused due to that fact that a vaporization of $AlC_3$ immediately occurred owing to a high vapor pressure thereof so that the etched $Al_2O_3$ was continuously removed according to the reaction expressed by the following equation (4).

$$3TiCl_4 + 2Al_2O_3 \rightarrow 3Ti + 4AlCl_3 + 3O_2 \qquad (4)$$

Figure 8:
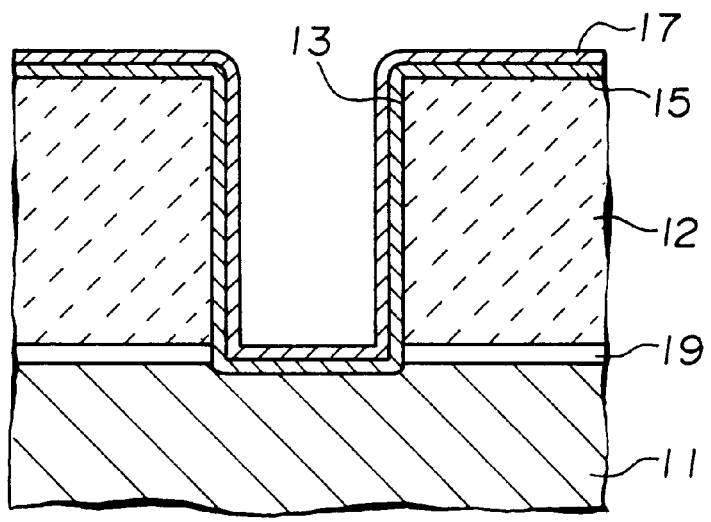
FIG. 8 is a sectional view schematically showing a semiconductor wafer in which a second titanium film layer is formed on the first titanium film layer shown in FIG. 7, according to the second process of the present invention.

Successively, a second titanium film layer 17 was formed on the first titanium film layer 15, as shown in FIG. 8, under the same condition (B) as described in Example 1, in which the mixing ratio of the $TiCl_4$ gas to the hydrogen gas was adjusted to a relatively large value. The thus produced second titanium film layer 17 exhibited an extremely smooth surface.

Figure 9:
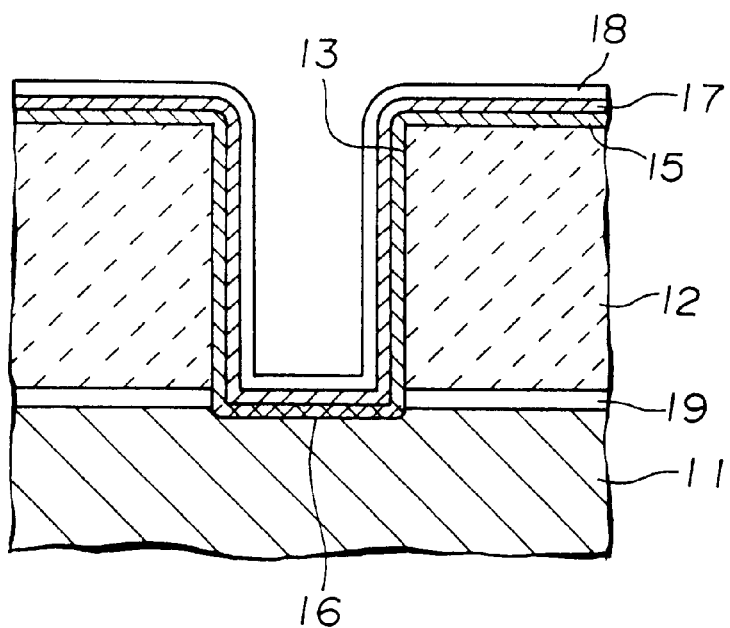
FIG. 9 is a sectional view schematically showing a semiconductor wafer in which a titanium nitride (TiN) film layer is formed on the second titanium film layer shown in FIG. 8, according to the second process of the present invention.

Thereafter, the semiconductor wafer was placed within the same chamber of the ECR plasma CVD apparatus under the same condition as described for the formation of the titanium nitride film layer 18 in Example 1 in which the nitrogen ($N_2$) gas was added to the reaction system, so that a titanium nitride film layer 18 was formed on the second titanium film layer 17, as shown in FIG. 9.

In the process mentioned above, a barrier metal layer having a two-layered structure composed of the titanium film layer 17 and the titanium nitride film layer 18 was produced within the via hole 13 with a good coverage of the surface to be treated and without damage to the wiring film layer 11. Further, the barrier metal layer was covered with an upper wiring film layer (not shown) made of an aluminum-series material. As a result, it was confirmed that the aluminum-series material was buried into the contact hole 13 in a suitable manner. In addition, it was also confirmed that the thus formed barrier metal layer had an ohmic contact of a low resistance at boundary regions adjacent to both the lower wiring film layer 11 and the upper wiring film layer.

Example 3

This example shows a third process of forming a refractory metal thin film on a substrate according to the present invention. In Example 3, a titanium film layer as a refractory metal thin film was deposited at least on bottom and side surfaces of a contact hole formed through an interlevel insulator film layer on a silicon substrate by using a plasma chemical vapor deposition method in which a surface of the silicon substrate corresponding to the bottom of the contact hole was beforehand subjected to a nitriding treatment. The process is explained by referring to FIGS. 10 to 13.

First, a semiconductor wafer was prepared in the same manner as described in Example 1. The thus prepared semiconductor wafer was washed with dilute hydrofluoric acid and then subjected to a plasma treatment to remove a native oxide film existing on a surface of the silicon substrate which was exposed to an interior of the contact hole.

Further, a plasma treatment was carried out by placing the semiconductor wafer within the chamber of an ECR plasma CVD apparatus to nitride the surface of the silicon substrate under the following conditions.

Figure 10:
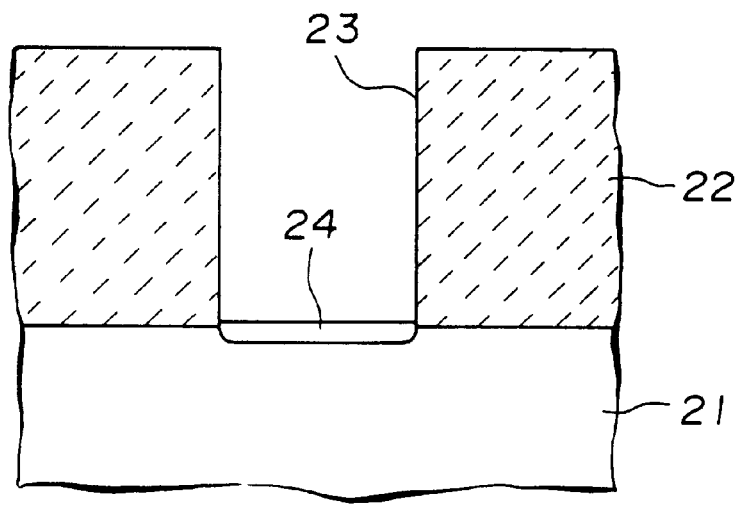
FIG. 10 is a sectional view schematically showing a semiconductor wafer in which a portion of a surface of the silicon substrate which is exposed to an interior of the contact hole is nitrided according to a third process of the present invention.

Conditions of Plasma Treatment for Nitriding Si Substrate:
Gas introduced:
(1) $N_2$ gas, flow rate; 50 sccm
(2) Ar gas, flow rate; 50 sccm
Gas Pressure: 0.2 Pa
Temperature: 450° C.
Power of Microwave: 2.8 kW Aa a result, as shown in FIG. 10, the semiconductor wafer composed of the silicon substrate 21 and the interlevel insulator film layer 22 formed thereon with the contact hole 23 was subjected to the nitriding treatment so that a $Si_3N_4$ film layer 24 was formed on a portion of a surface of the silicon substrate 21 which is exposed to an interior of the contact hole 23.

Figure 11:
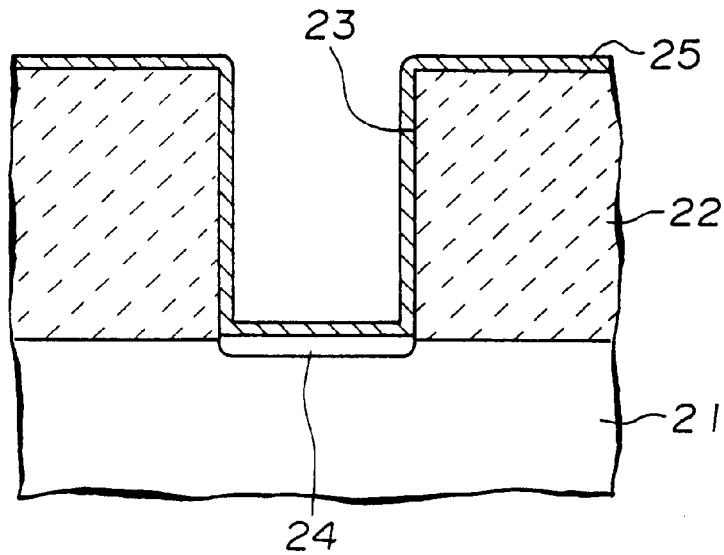
FIG. 11 is a sectional view schematically showing a semiconductor wafer in which a titanium film layer is formed on the semiconductor wafer shown in FIG. 10, according to the third process of the present invention.

Thereafter, a film formation was carried out in the chamber of the ECR plasma CVD apparatus under the same condition (B) as used in Example 1 above so that a titanium film layer 25 was formed on the semiconductor wafer, as shown in FIG. 11. It was confirmed that the titanium film layer 25 exhibited an excellent surface smoothness.

Figure 12:
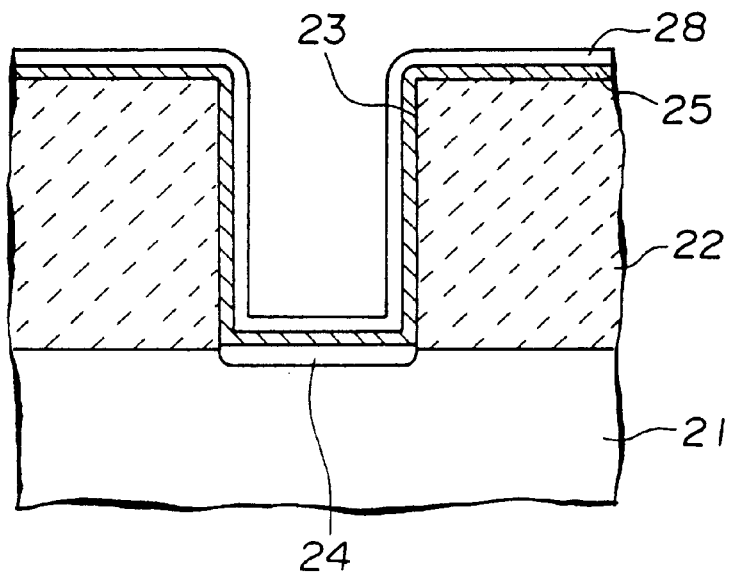
FIG. 12 is a sectional view schematically showing a semiconductor wafer in which a titanium nitride (TiN) film layer is formed on the titanium film layer shown in FIG. 11, according to the third process of the present invention.

Successively, a film formation was further carried out in the chamber of the ECR plasma CVD apparatus in the same manner as described in Example 1 above while adding a $N_2$ gas to the reaction system so that a titanium nitride (TiN) film layer 28 was formed on the titanium film layer 25, as shown in FIG. 12.

Figure 13:
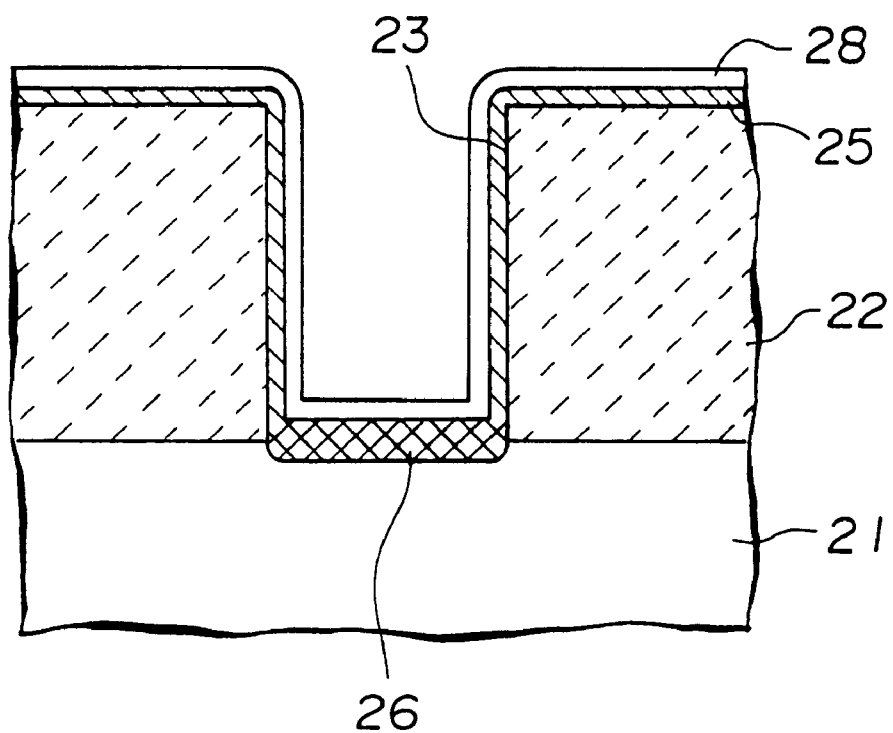
FIG. 13 is a sectional view schematically showing a semiconductor wafer in which a $TiSi_2$ film layer is formed on the titanium nitride film layer shown in FIG. 12, by a heat treatment according to the third process of the present invention.

Next, the thus prepared semiconductor wafer was subjected to a heat treatment to react the $Si_3N_4$ film layer 24 with the titanium film layer 25 formed thereon so that a $TiSi_2$ film layer 26 was formed at the bottom portion of the contact hole 23, as shown in FIG. 13.

In the process mentioned above, a barrier metal layer having a two-layered structure composed of the titanium film layer 25 and the titanium nitride film layer 28 was produced within the contact hole 23 with a good coverage of the surface to be treated and without damage to the silicon substrate 21. Further, the barrier metal layer was covered with an upper wiring layer (not shown) made of an aluminum-series material. As a result, it was confirmed that the aluminum-series material was buried into the contact hole 23 in a desirable manner. In addition, it was also confirmed that the thus formed barrier metal layer had an ohmic contact of a low resistance at boundary regions adjacent to both the silicon substrate 21 and the upper wiring film layer, and showed an effect for preventing a grain boundary diffusion of aluminum at the boundary region to the upper wiring film layer.

Meanwhile, the reason why the etching of the silicon substrate 1 was not caused upon the formation of the titanium film layer 25 mentioned above, is that a bonding energy between a silicon atom and a nitrogen atom is as large as 439 kJ/mole while a bonding energy between a silicon atom and a chlorine atom is 322 kJ/mole, so that the $Si_3N_4$ film layer 24 did not suffer from etching by the $TiCl_4$ gas.

In the above description, there are demonstrated various examples concerning the process of forming the refractory metal thin film according to the present invention. However, the present invention is not intended to be limited thereto. For example, The plasma treatment for removing the native oxide films 4 and 14 may be carried out in the presence of a $SiH_4$ gas. In this case, the native oxide films on the silicon substrate can be reduced according to the reaction represented by the following equation (5).

$$SiH_4 + SiO_2 \rightarrow 2Si + 2H_2O \qquad (5)$$

Further, in Example 2, a material composed of aluminum and 0.5% copper was used for the preparation of the wiring film layer 11. However, any other aluminum-series materials or tungsten-series materials may be also employed for the purpose.

Furthermore, in Example 3, the portion of the silicon substrate 21 which was exposed to the interior of the contact hole 23 was beforehand nitrided. However, a similar effect may be obtained by beforehand nitriding the wiring film layer made of an aluminum-series material or a tungsten-series material and formed within the via hole. The nitriding treatment may be also carried out by using a $NH_3$ gas, a $N_2H_4$ gas or the like in addition to the $N_2$ gas.

In the above-mentioned examples, the respective plasma treatments or steps from the removal of the native oxide film up to the formation of the titanium film layer and the titanium nitride film layer were carried out in the same chamber of the ECR plasma CVD apparatus. However, the respective plasma treatments or steps may be carried out in different chambers of the plural apparatuses in such a manner that the semiconductor wafer is transferred from one chamber to the other chamber while preventing the semiconductor wafer from being in contact with the atmosphere. Alternatively, the plasma treatments or steps may be carried out by using a plasma CVD apparatus having multiple chambers. Further, in the above-mentioned examples, the ECR plasma CVD apparatus was used for performing the plasma treatments or steps. However, the plasma treatments of the present invention may be also performed by using a plane-parallel plate type plasma CVD apparatus, a helicon wave type plasma CVD apparatus, an induction coupling type plasma CVD apparatus or other known plasma CVD apparatuses.

In addition, with respect to a construction or a material of the semiconductor wafer and a kind of the refractory metal to be formed, any appropriate modifications and changes may be made without departing from the spirits and scope of the invention.

What is claimed is:

1. A process of forming a refractory metal thin film on a substrate, comprising the steps of
    preliminarily removing a native oxide film on said substrate;
    nitriding a surface of said substrate, while preventing said substrate from coming into contact with an ambient atmosphere, by using a gas which comprises a nitrogen-containing molecule different from a molecule used in said removing a native oxide film; and
    subjecting a gaseous mixture containing a halide of a refractory metal and a hydrogen gas to a plasma chemical vapor deposition to deposit said refractory metal thin film on said substrate,
    wherein said substrate forms a bottom surface of a contact hole, said contact hole formed through an interlevel insulator film layer formed on said substrate.

2. A process according to claim 1, wherein said gas which comprises a nitrogen-containing molecule comprises at least one gaseous material selected from the group consisting of a nitrogen gas, an ammonia gas and a hydrazine gas.

3. A process according to claim 1, further comprising the step of:
    forming an outer refractory metal thin film comprising TiN over said refractory metal thin film.

4. A process according to claim 1, wherein said contact hole has an aspect ratio of about 5.

5. A process according to claim 1, wherein said preliminarily removing a native oxide film on said substrate comprises washing said substrate with a hydrofluoric acid solution, and subjecting said substrate to a plasma treatment using $H_2$ and Ar gas.

6. A process according to claim 5, wherein said subjecting said substrate to a plasma treatment comprises introducing said $H_2$ and Ar gases in an electron cyclotron resonance plasma chemical vapor deposition apparatus.

7. A process according to claim 1, wherein said nitriding the surface of said substrate is performed within a chamber of an electron cyclotron resonance plasma chemical vapor deposition apparatus.

8. A process according to claim 1, wherein said refractory metal thin film is deposited within a chamber of an electron cyclotron resonance plasma chemical vapor deposition apparatus.

9. A process according to claim 1, wherein as a result of said nitriding a surface of said substrate, a $Si_3N_4$ film layer is formed on said substrate by reacting said nitrogen-containing compound with an outermost portion of said substrate.

10. A process according to claim 9, further comprising the steps of:
    reacting said $Si_3N_4$ film layer with an innermost portion of said refractory metal thin film; and
    covering said refractory metal thin film with a wiring layer comprising an aluminum series material.

11. A process according to claim 1, wherein said refractory metal thin film is further deposited on said interlevel insulator, film layer formed on said substrate, thereby forming titanium sidewalls adjacent to said bottom surface.

12. A process according to claim 11, wherein as a result of said nitriding a surface of said substrate, a $Si_3N_4$ film layer is formed on said substrate by said nitrogen-containing compound and an outermost portion of said substrate.

13. A process according to claim 12, further comprising the step of:
    applying a heat treatment to react said $Si_3N_4$ film layer with an innermost portion of said refractory metal thin film, whereby a titanium silicide layer is formed on said bottom surface of said contact hole, adjacent to said titanium sidewalls.

14. A process of forming a refractory metal thin film on a substrate, comprising the steps of:
    preliminarily removing a native oxide film on said substrate;
    nitriding an outermost portion of said surface of said substrate, to form a $Si_3N_4$ film layer on said substrate, while preventing said substrate from coming into contact with an ambient atmosphere, by using a gas which comprises a nitrogen-containing molecule different from a molecule used in said removing a native oxide film;
    subjecting a gaseous mixture containing a halide of a refractory metal and a hydrogen gas to a plasma chemical vapor deposition to deposit said refractory metal thin film on said substrate; and
    reacting said $Si_3N_4$ film layer with an innermost portion of said refractory metal thin film,
    wherein said reacting said $Si_3N_4$ film layer with an innermost portion of said refractory metal thin film is performed by use of a heat treatment.

* * * * *